United States Patent
Huang et al.

(10) Patent No.: US 12,417,967 B2
(45) Date of Patent: Sep. 16, 2025

(54) LOW PARASITIC INDUCTANCE POWER MODULE FEATURING STAGGERED INTERLEAVING CONDUCTIVE MEMBERS

(71) Applicant: SENTEC E&E CO., LTD., Taoyuan (TW)

(72) Inventors: Jason An Cheng Huang, Taoyuan (TW); Kun-Tzu Chen, Taoyuan (TW); Liang-Yo Chen, Taoyuan (TW); Nai-His Hu, Taoyuan (TW); Siao-Deng Huang, Taoyuan (TW)

(73) Assignee: SENTEC E&E CO., LTD., Taoyuan (TW)

( * ) Notice: Subject to any disclaimer, the term of this patent is extended or adjusted under 35 U.S.C. 154(b) by 504 days.

(21) Appl. No.: 17/892,008

(22) Filed: Aug. 19, 2022

(65) Prior Publication Data

US 2023/0215789 A1 Jul. 6, 2023

(30) Foreign Application Priority Data

Jan. 6, 2022 (TW) .................................. 111100567
Feb. 17, 2022 (TW) .................................. 111105767

(51) Int. Cl.
*H01L 23/00* (2006.01)
*H01L 23/498* (2006.01)
*H01L 25/07* (2006.01)

(52) U.S. Cl.
CPC .. *H01L 23/49811* (2013.01); *H01L 23/49822* (2013.01); *H01L 23/49833* (2013.01); *H01L 23/49844* (2013.01); *H01L 24/48* (2013.01); *H01L 25/072* (2013.01); *H01L 2224/48155* (2013.01); *H01L 2224/48175* (2013.01); *H01L 2224/48225* (2013.01); *H01L 2924/10272* (2013.01); *H01L 2924/1033* (2013.01); *H01L 2924/30107* (2013.01)

(58) Field of Classification Search
CPC .............................. H01L 25/072; H01L 24/49
See application file for complete search history.

(56) References Cited

FOREIGN PATENT DOCUMENTS

| CN | 104488078 A | * | 4/2015 | ........... H01L 23/049 |
| WO | WO-2015176985 A1 | * | 11/2015 | ......... H01L 23/3735 |

* cited by examiner

*Primary Examiner* — Michele Fan
(74) *Attorney, Agent, or Firm* — Ying-Ting Chen; Law Offcie of Michael Chen

(57) ABSTRACT

A low parasitic inductance power module featuring staggered interleaving conductive members, including: at least one base extending in a length direction; a substrate on which at least one input bus bar and at least one output bus bar are provided; a first unit including a first circuit base portion disposed on the base in a width direction, a plurality of first power devices being disposed on the first circuit base portion, each first power device having a first current input end and a first current output end which are parallel connected, the first current input end or the first current output end being conducted to the first circuit base portion; and a second unit. The units are serially-connected to the bus bars via input conductive members and output conductive members arrayed in a staggered interleaving mode, whereby to create individual inductances counteracting with each other, reducing overall parasitic inductance.

5 Claims, 9 Drawing Sheets

PRIOR ART

PRIOR ART

LOW PARASITIC INDUCTANCE POWER MODULE FEATURING STAGGERED INTERLEAVING CONDUCTIVE MEMBERS

FIELD

The disclosure relates to a power module, and more particularly relates to a low parasitic inductance power module featuring staggered interleaving conductive members.

BACKGROUND

As one of trending technologies, third-generation semiconductors play a pivotal role in the development of 5G, electric vehicles (EVs), and regenerative energies. The third-generation semiconductors (or wide bandgap (WBG) semiconductors) generally refer to Silicon Carbide (SiC) or Gallium Nitride (GaN), the bandgap of which is about three times that of conventional semiconductors Silicon (Si) and Gallium Arsenide (GaAs). The larger bandgap allows WBG power devices to operate at high frequencies, high temperatures and high voltages, achieving optimum efficiency and stability in general.

Among various applications of third-generation semiconductors, demands from electric vehicles are undoubtedly a main driving force for the development of power semiconductor devices. The three core technologies for electric vehicles are "battery," "motor," and "power control unit", which will be briefly introduced below: first, a three-phase motor as the heart of an electric vehicle, which leverages an induced RMF (Rotating Magnetic Field) to actuate the rotor in the motor to rotate to further drive the shaft, wherein to induce the RMF, the three-phase motor requires alternating current (AC) with phase difference as the power source; however, a battery pack (e.g., a lithium battery) equipped to electric vehicles is a direct-current (DC) power supply, such that a DC-to-AC conversion is needed between the battery pack and the motor while this conversion is implemented via an inverter, the brain of electric vehicles.

The inverter not only serves a purpose of converting an input current into an AC signal, but also may control the three-phase motor with technologies such as pulse width modulation (PWM). The inverter is essentially a power module comprising the power semiconductors identified above, which realizes electric control of the motor via circuit design. For example, the faster the RMF revolves, the higher the speed of the rotor in the motor is, wherein the speed of rotation of the RMF is dictated by AC signal frequency, i.e., the electric vehicle may directly change its motor speed by controlling the frequency of the input current, which provides a more reliable, linear control than a conventional ICE (Internal Combustion Engine) mechanism. In addition, the magnitude of current inputted in the motor also has a direct impact on the intensity of induced magnetic field; therefore, an electric vehicle with a high-power output surely needs a power module that can handle high current.

According to Ampere's Law, in an AC circuit, a time-varying magnetic field is created when electric current travels through a wire or a power component, while according to Faraday's Law and Lenz's Law, the time-varying magnetic field in turn creates an opposing induced electromotive force that influences the current signal. This effect, due to its analogousness to inductance, is usually referred to as "parasitic inductance" or "stray inductance," which is practically unwanted as it hinders fast transform of current signals. Usually, such effect may be ignored under an operating condition where the frequency is not high; however, under high-frequency, high-current operating conditions, the impact of stray inductance will become increasingly exacerbated, which likely results in phase delay or phase lead of signals, causing overall distortion of the signals, thereby affecting transmission and conversion efficiency, degrading stability, and significantly affecting the motor's efficiency in converting the electric energy to mechanical energy.

The previously filed U.S. Pat. No. 10,405,450 reveals problems such as voltage overshoot and ringing induced by parasitic inductance in a high-power module; besides, a power module with a paralleled configuration further has a problem of inhomogeneous temperature distribution due to current imbalance. All of the above factors will result in circuit system instability, degraded conversion efficiency, or even limited maximum switching frequency. As illustrated in FIG. 1 accompanied to the present disclosure, the U.S. Pat. No. 10,405,450 provides a solution of reducing circuit length, increasing cross-sectional area of conductors, creating counteracting magnetic fields, minimizing module height, and placing the power device in closer proximity to the terminals, wherein after the current traveling through two power devices 7 along the current direction 8, a reflow zone 9 at the output bus bar is formed, which may reduce locally induced parasitic inductance. However, the disclosed layout manner has a limited effect in reducing parasitic inductance since the output bus bars located slightly above the center of the topology can only be placed in close proximity to the underlying circuit within a partial area of the center while the output bus bars in the right side of the topology need to be spaced apart so as to avoid the bonding zone. Furthermore, as illustrated in FIG. 2 accompanied to the present disclosure, the U.S. Pat. No. 8,637,964 also discloses a low stray inductance power module, wherein a reflow path is formed in the power module along the current direction 8 by placing the reflow current as close to the original current path as possible in the topology. However, this horizontally dual-loop layout design would result in inhomogeneous current in the case of a high current, high frequency inversion due to inconsistent travelling distances between the inner current flow path and the outer current flow path of each loop; in addition, respective outer current flow paths are relatively distant from each other, which limits the effect in countering stray inductances.

In view of the above, parasitic inductance is unwanted, but unavoidably present in a high frequency circuit. To address this problem, the disclosure provides a power module, which may effectively, significantly reduce the overall parasitic inductance via a special circuit connection layout wherein parallel connected conductive members are arrayed in a staggered interleaving topology; particularly by closely arranging the source bus bars and the drain bus bars at lateral edges; as such, a high-frequency, high-current power module may achieve a better electric performance without being degraded by stray inductance; besides, such arrayed source bus bars and drain bus bars facilitate circuit leading-out.

SUMMARY

Embodiments of the disclosure provide a low parasitic inductance power module, which significantly reduces the induced parasitic inductance by paralleling the high current signals and arranging the input and output wires in a staggered interleaving mode.

Embodiments of the disclosure provide a low parasitic inductance power module, wherein the source bus bars and drain bus bars are arrayed collectively at lateral edges or in the center to facilitate circuit leading-out.

Embodiments of the disclosure provide a low parasitic inductance power module, which renders a higher scalability in designing a circuit structure for the low parasitic inductance power module by a staggered interleaving configuration enabling shift between horizontal and vertical directions.

The low parasitic inductance power module according to the disclosure is applicable to an apparatus which needs high-frequency, high power input, such as a motor for an electric vehicle; the low parasitic inductance power module comprises: at least one electrically insulative base extending along a length direction; a substrate provided with at least one current input bus bar along a width direction perpendicular to the length direction and at least one current output bus bar which is parallel to the current input bus bar and electrically insulated from the current input bus bar; a first unit comprising a first circuit base portion disposed on the electrically insulative base along a width direction perpendicular to the length direction, a plurality of first power devices being disposed on the first circuit base portion, each of the first power devices having a first current input end and a first current output end, the first current input ends of all first power devices being parallel connected, the first current output ends of all first power devices being parallel connected, wherein the first current input ends are conductively mounted to the first circuit base portion, or alternatively, the first current output ends are conductively mounted to the first circuit base portion; and a second unit comprising a second circuit base portion disposed on the electrically insulative base along the width direction perpendicular to the length direction, the second circuit base portion being spaced from the first circuit base portion in the length direction, a plurality of second power devices being disposed on the second circuit base portion, each of the first second power elements having a second current input end and a second current output end, the second current inputs of all second power devices being parallel connected, the second current output ends of all second power devices being parallel connected, wherein the second current input ends are conductively mounted to the second circuit base portion, or alternatively, the second current output ends are conductively mounted to the second circuit base portion; wherein one end of the first unit and one end of the second unit are serially-connected along the length direction via a plurality of staggered interleaving serially-connected conductive members, respectively; the opposite other end of the first unit and the opposite other end of the second unit are serially-connected to the current input bus bar and the current output bus bar via a plurality of mutually staggered input conductive members and a plurality of mutually staggered output conductive members, respectively; and when the serially-connected conductive members, the input conductive members, and the output conductive members have their projections overlap in the length direction, their projections in the width direction are arrayed in a staggered interleaving mode and/or their projections overlap with each other in a height direction perpendicular to the length direction and the width direction; whereby when current flows through the staggered serially-connected conductive members, the staggered input conductive members, and the staggered output conductive members, individual inductances are countered with each other, thereby reducing the overall parasitic inductance.

According to the low parasitic inductance power module as disclosed, a high current signal inputted in the module is evenly shared by paralleled power semiconductors such as SiC and GaN, wherein each power semiconductor is arranged distributed in the width direction with a plurality of wires, such that lengthwise interconnection of the power semiconductors enables high current to be stably inputted and outputted in a shared mode; the input and output conductive members designed in a staggered interleaving topology enables mutual counteraction of the induced magnetic fields produced by individual conductive members within a proximal distance range, which further effectively reduces the parasitic inductance effect created by the high-frequency current; the input and output wires designed in a staggered interleaving topology enables mutual counteraction of the induced magnetic fields produced by individual wires within a proximal distance range, which further effectively reduces the parasitic inductance effect created by the high-frequency current; particularly, irrespective of interleaving in the width direction or interleaving in the height direction, or even simultaneous interleaving in both the width direction and the height direction, the height limit or width limit may be flexibility satisfied for users with different structural demands, thereby enabling fabrication of a high power module with superb high-frequency response and electric performance, which can effectively reduce the adverse impact of parasitic impedance, thereby satisfying service demands and overcoming the problems of conventional power modules.

DETAILED DESCRIPTION

Figure 1:
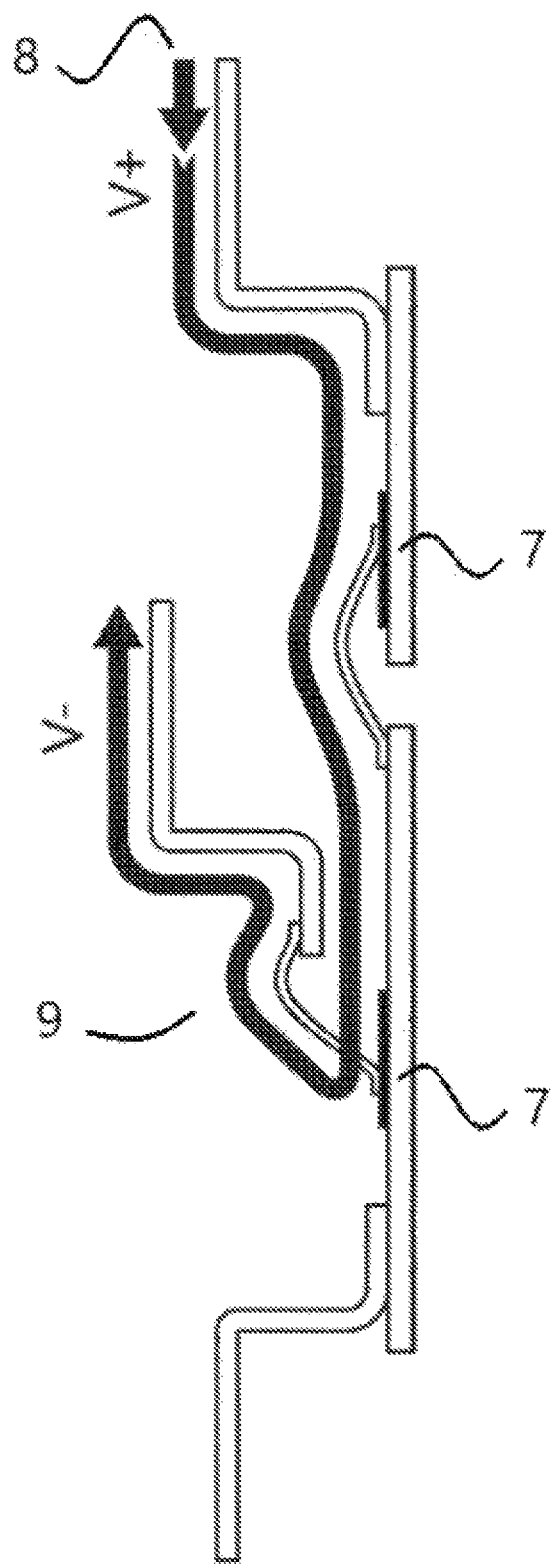
FIG. 1 is a schematic diagram of a conventional technology.
Figure 2:
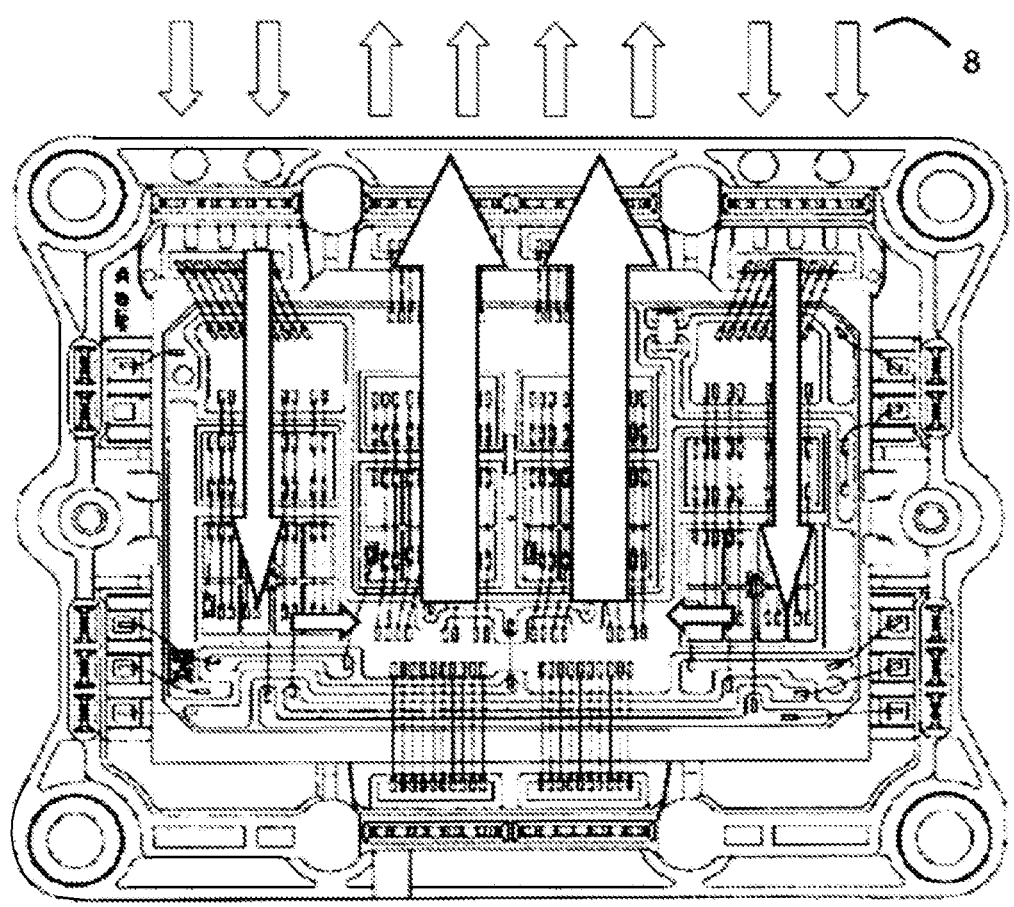
FIG. 2 is a schematic diagram of another conventional technology.

Relevant technical contents, features and effects of the disclosure may be apparent through the examples described below with reference to the accompanying drawings, wherein like or similar components in various examples are represented with like or similar reference numerals.

Figure 3:
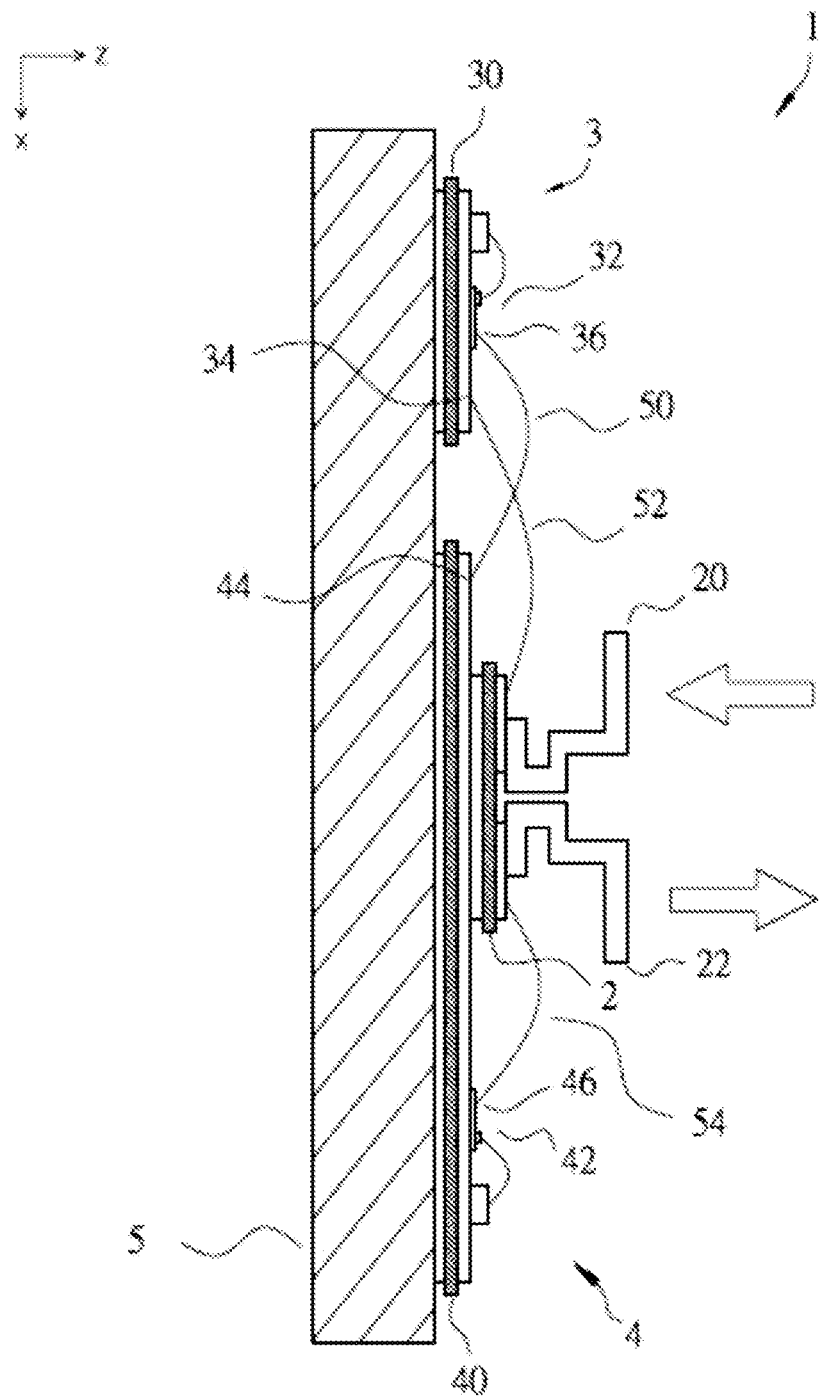
FIG. 3 is a schematic side view of a first example of the disclosure, illustrating how to array wires to be approximate in height directions so as to counteract stray inductances during the circuit input and output process.
Figure 4:
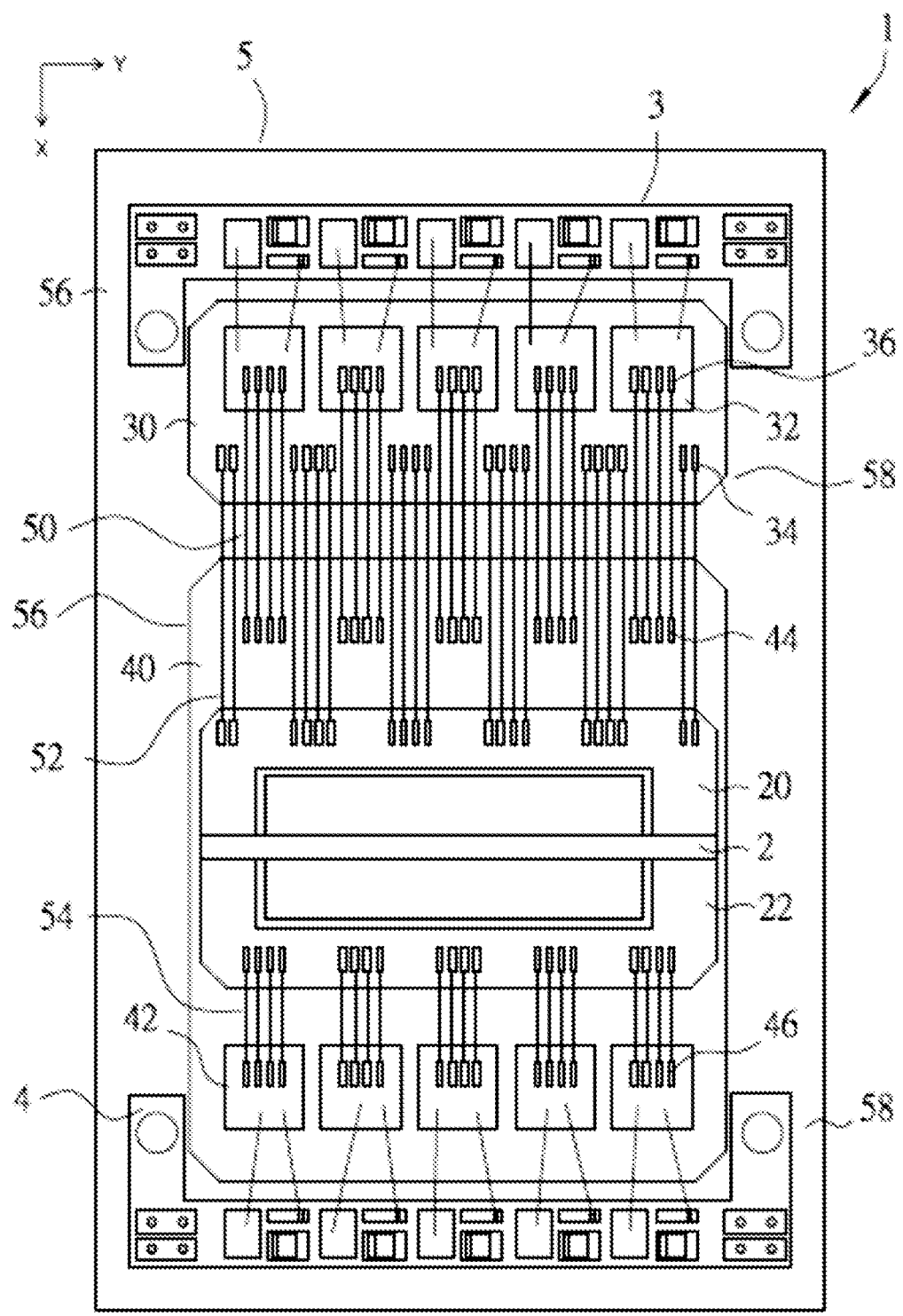
FIG. 4 is a top view of the example of FIG. 3, illustrating how the input conductive members, the output conductive members, and the serially-connected conductive members are arranged in a staggered interleaving pattern in the length and width plane projection directions.
Figure 5:
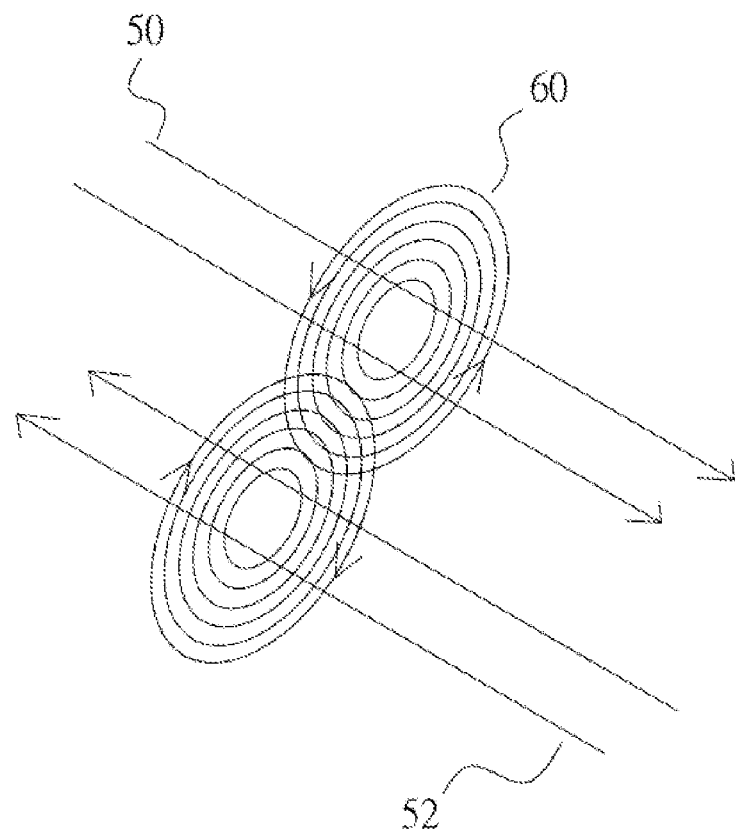
FIG. 5 is a schematic diagram of a current path projection of the example of FIG. 3, illustrating the counteraction principle of parasitic inductances.

FIGS. 3 to 5 illustrate a first example of a low parasitic inductance power module 1, comprising: an electrically insulated base 5, wherein a first circuit board 3 and a second circuit board 4 are disposed over the electrically insulated base 5. To ease the description, the two circuit boards are arrayed along length direction X defined in the disclosure, while the perpendicular direction in FIG. 3 is defined as height direction Z, and the direction normal to the paper surface is defined as width direction Y. In this example, the electrically insulated base 5 is made of a metal material, such a cooling device (not shown) may be placed underneath the power devices. In this example, as illustrated in the figures, the second circuit board has a width equal to that of the first circuit board, but a greater length, allowing for disposing a substrate 2 over the second circuit board 40. The purpose for this design will be more apparent through the detailed description below. A current input bus bar 20 and a current output bus bar 22 are further disposed on the substrate 2, for inputting a high current signal (tens to hundreds of amperes) into the module.

In this example, a first unit 3 is connected to the current input bus bar 20, the first unit 3 comprising a first circuit board 30 extending along the width direction Y, wherein for example, five first power devices 32 are provided on the first circuit base portion 30. In this example, the first power devices 32 refer to power transistors fabricated with SiC. Of course, in alternative examples, other types of power transistors may be contemplated depending on specific applications, and the number of the power transistors may be adjusted as well. Therefore, the exemplary explanations here should not be construed as limiting. In this example, the first circuit board refers to a sheet of circuit board insulatively mounted on the electrically insulative base 5, wherein input current starts from the current input bus bar 20 and flows across a plurality of paralleled input conductive members 52 into the first power devices 32. To facilitate explanation, the electrodes disposed underlying the first power devices 32 and conductively bonded to the first circuit board 30 are defined as first current input terminals 34, and the top sides opposite the first current input terminals 34 are defined as first current output terminals 36. In this example, the input conductive members 52 refer to twenty wires which are parallel connected and discretely bonded to the first circuit board 30; this allows for even sharing of an input high current of tens to hundreds of amperes, effectively mitigating the heating effect of current produced by each conductive member.

In the first unit 3 of this example, each of the first power devices 32 is subjected to a first gate signal to synchronously control the respective first power devices 32. The first gate signal activates conduction between the source and collector of individual power transistors, such that the input current signal is transmitted from the plurality of paralleled first current output terminals 36 through serially-connected conductive members 50 to the second current input terminals 44 of the second circuit board 40. It is noted that during the process of the current signal entering and leaving the first unit 3, the traversed path includes the serially-connected conductive members 50 and the input conductive members 52. In this example, forty wires are configured, which form an interleaved structure in a three-dimensional space.

To facilitate explanation, in the disclosure, the respective first power devices 32 serve as demarcations; as shown in FIG. 4, the current starting from the current input bus bar 20 and conducted into the respective first current input terminals 34 via twenty input conductive members 52 is defined as input current, while the current starting from the first current output terminals 36 and transmitted via twenty serially-connected conductive members 50 to the second circuit board 40 is defined as output current. It is seen that in direction X, the lengthwise projection of the input current path encompassing the input conductive members 52 plus a small segment of the first circuit board 30 overlaps with that of the output current path encompassing the serially-connected conductive members 50 plus a small segment of the second circuit board 40, i.e., the input current and the output current traverse almost the same path along the length direction X. In this case, the forty conductive members (including twenty input conductive members and twenty output conductive members) are interleaved for example with four conductive members as a unit group in the width direction and the height direction of the three-dimensional space, while interleaved with two conductive members as a unit group in the outermost side of the width direction. This staggered interleaving layout realizes placement of every two serially-connected conductive members 50 in close proximity to two corresponding input conductive members 52, the topology of which is illustrated in FIG. 5; finally, according to Ampere's Law, i.e., the magnetic field path integral of a closed loop is proportional to magnitude of the current traveling through the closed loop, it may be derived that the magnetic field path integral of the magnetic field integral path 60 at the closed loop encompassing four currents is zero, thereby achieving an effect of local inductance cancellation.

In this example, the conductive members do not extend exactly along direction X, but have components in width direction Y and height direction Z; however, those skilled in the art should understand that this staggered interleaving loop design may ensure sufficiently even distribution of the overall current while still maintaining a close-proximity return loop structure in the three-dimensional space, which may reduce the overall stray inductance of the power module below 5 nH, or even below 2 nH. Compared with the distant loop designs in the above-identified cited patents, the disclosure has a more homogenized current distribution; through Ampere's Law analysis, the disclosure also achieves a far smaller path integral, such that it is unnecessary to extend the integral area to cover the cross section of the whole module; in other words, even the cited patents had proposed a theoretical concept of reducing stray inductance, their overly large return current distribution area not only results in uneven current, but also results in a very wide cross-section area of magnetic field distribution for cancelling the stray inductance; therefore, their practical effect of counteracting the induced magnetic field is limited. In contrast, the staggered interleaving design of the disclosure achieves a superb effect in parasitic inductance cancellation.

Similarly, after the current signal arrives at the second unit 4 from the first unit 3, it will enter the respective second power devices 42 via respective second current input terminals 44. As described above, the second power devices 42 are also subjected to control by a corresponding gate signal, such that the overall current is conducted into the current output bus bar 22 via the second current output terminals 46 and the output conductive members 54 and finally outputted; likewise, the second unit 4 is also designed with a structural topology that the input currents and the output currents are staggered interleaved with each other; this allows for significant cancellation of the stray inductance in the second half current flowing process like in the first half current flowing process. In this example, both of the first circuit board 30 and the second circuit board 40 are direct-bond-copper (DBC) circuit boards, which are structurally disposed exactly beneath the output conductive members 54; another substrate is further provided over the second circuit board 40, for arranging the current input bus bar 20 and the current output bus bar 22 in a mutually insulated, paralleled, and spaced apart manner, such that the current flowing across the substrate and the current flowing across the second circuit board 40 are in opposite directions, but evenly distributed. Although the overlap here does not realize a completely "staggered interleaving" mode, the overlap relationship between the upper and lower projections in direction Z, in conjunction with the mutually paralleling and proximity configuration, certain effect of parasitic inductance reduction is still achieved, such that there is no dead zone in the circuit topology featuring stray inductance counteraction.

To facilitate explanation, the disclosure further limits that the first unit 3 and the second unit 4 each have an end 56 and the other end 58, wherein the first unit 3 and the second unit 4 are connected via their respective ends 56, the other end 58 of the first unit 3 is connected to the current input bus bar 20, and the other end 58 of the second unit 4 is connected with the current output bus bar 22. Furthermore, appropriate spatial arrangement of the ends 56 and the other ends 58 enables the conductive members to have a returning, staggered interleaving structure.

Figure 6:
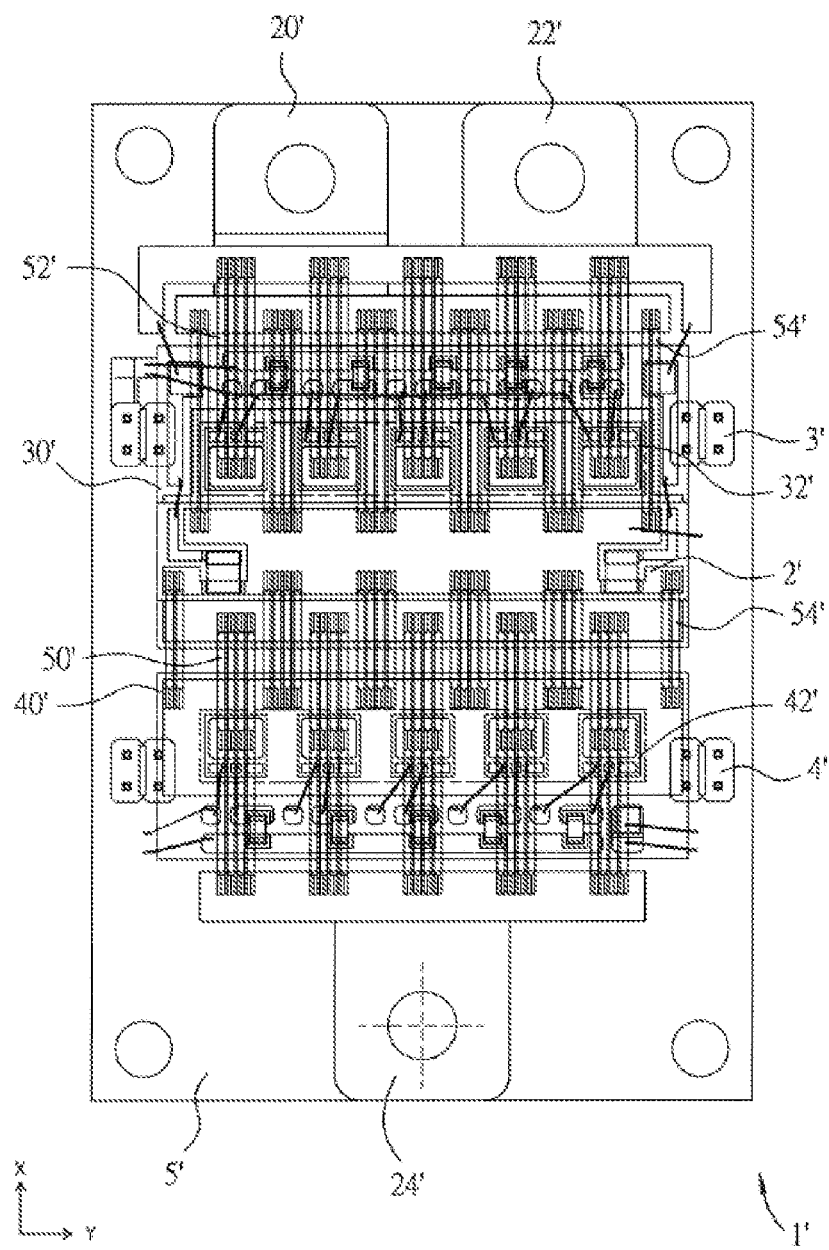
FIG. 6 is a top view of a second example of the disclosure.
Figure 7:
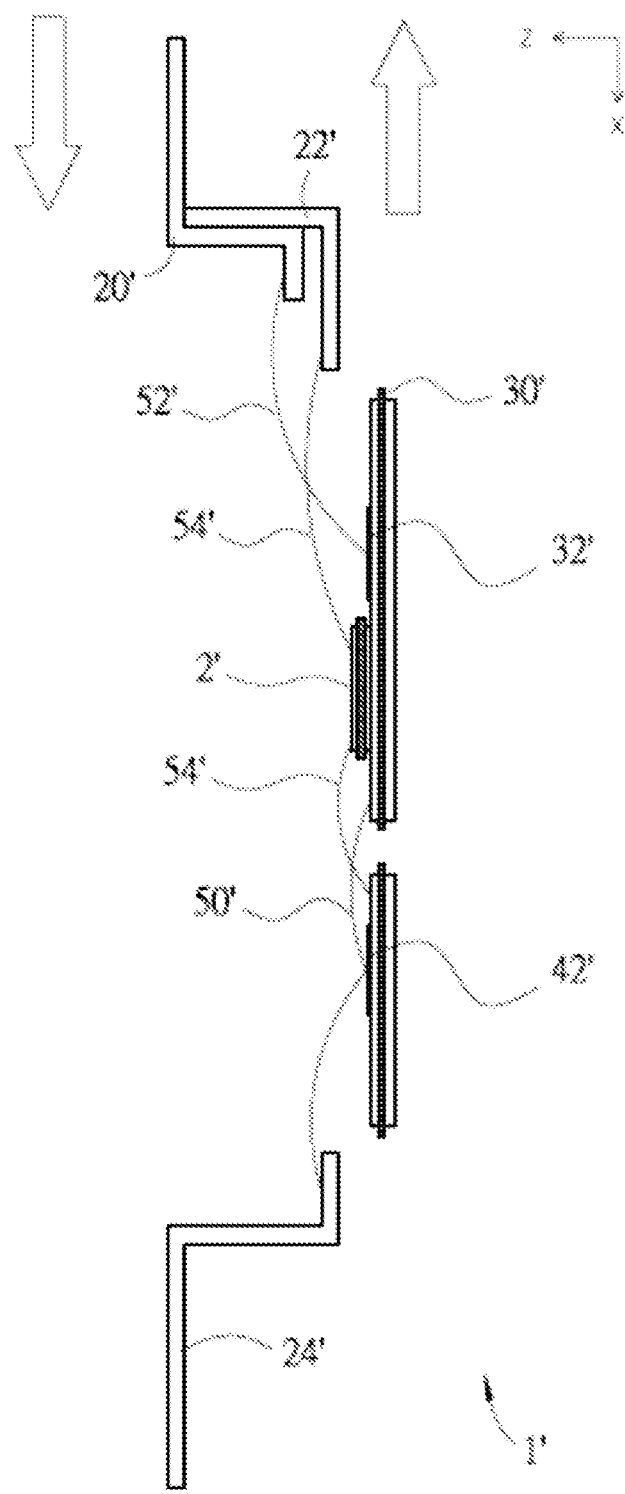
FIG. 7 is a side view of the example of FIG. 6.
Figure 8:
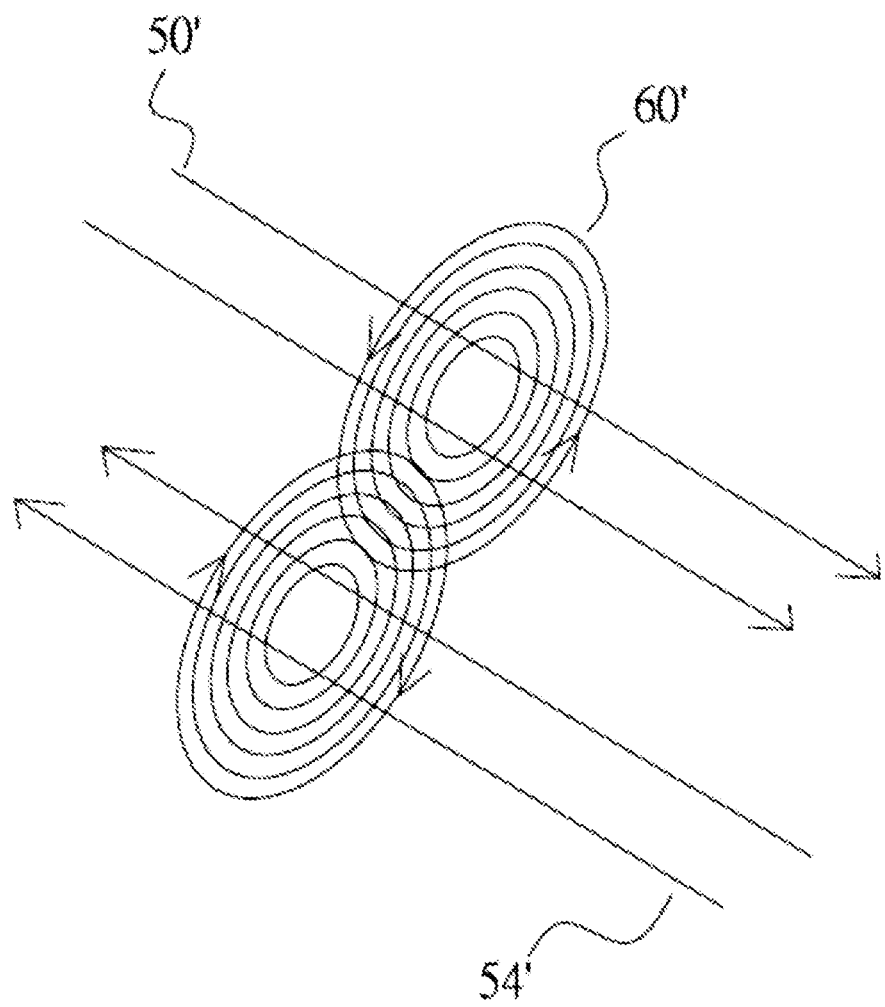
FIG. 8 is a schematic diagram of a current path projection of the example of FIG. 6, illustrating the counteraction principle of parasitic inductances.

Although the second circuit base portion 40 and the substrate 2 which vertically overlap are arranged side-by-side in direction Z in this example, the circuit configuration of this disclosure is not limited to such an arrangement. FIGS. 6 through 8 illustrate a power module 1' as a second example of the disclosure, wherein the electrically insulative base 5' is manufactured by a ceramic substrate, such that a cooling device (not shown) may be provided beneath power devices; a substrate 2', a first unit 3', and a second unit 4' are provided on the electrically insulative base 5', such that a current signal when being inputted travels sequentially through a current input bus bar 20', the first unit 3', the second unit 4', and the substrate 2', and is finally outputted from a current output bus bar 22'.

In this example, the substrate 2' and the bottom of the first unit 3' constitute the first circuit base portion 30', while the second unit 4' is disposed on a second circuit base portion 40'; however, in an alternative example, the substrate 2' may also be arranged on the second circuit base portion 40', which does not constitute a limitation to the disclosure; while the two circuit base portions are exemplified as two sheets of discretely arranged circuit boards. The current signal is conducted to the first power device 32' via an input conductive member 52' after traveling through the current input bus bar 20'; then the current signal arrives at the second power device 42' through the first circuit base portion 30' and the serially-connected conductive members 50'; and then the current signal is connected to the substrate 2' further through the second circuit base portion 40' and the output conductive members 54'; finally, the current signal is conducted to the current output bus bar 22' via another segment of output conductive members 54'. What has been described above is the current signal path, wherein the switching control of the power devices are likewise operated with a group of gate signal bus bar 24'.

The current signal path in this example has a staggered interleaving layout between corresponding parts at a plurality of positions. When viewed from the negative-x length direction to the positive-x length direction in FIG. 7: first, the current input bus bar 20' and the current output bus bar 22' are interleaved along the width direction y in the space; the input conductive members 52' and the output conductive members 54' are interleaved in a staggered manner; the substrate 2' and the first circuit base portion 30' are vertically overlapped; and the serially-connected conductive members 50' and the output conductive members 54' are interleaved in a staggered manner. The above structure may refer to FIG. 8, wherein the current directions of the serially-connected conductive members 50' and output conductive members 54' have staggered interleaving projections in plane XY, such that the magnetic field path integrals 60' of their respective currents create an inductance cancelled region to thereby effectively reduce local parasitic inductance. Furthermore, the difference between FIG. 5 and FIG. 8 indicates that any structure in which the serially-connected conductive members 50, the input conductive members 52, and the output conductive members 54 are arrayed in a staggered interleaving mode shall fall into the scope sought for protection in the disclosure, which shall not be affected by use of different nomenclatures with substantively identical meanings.

Figure 9:
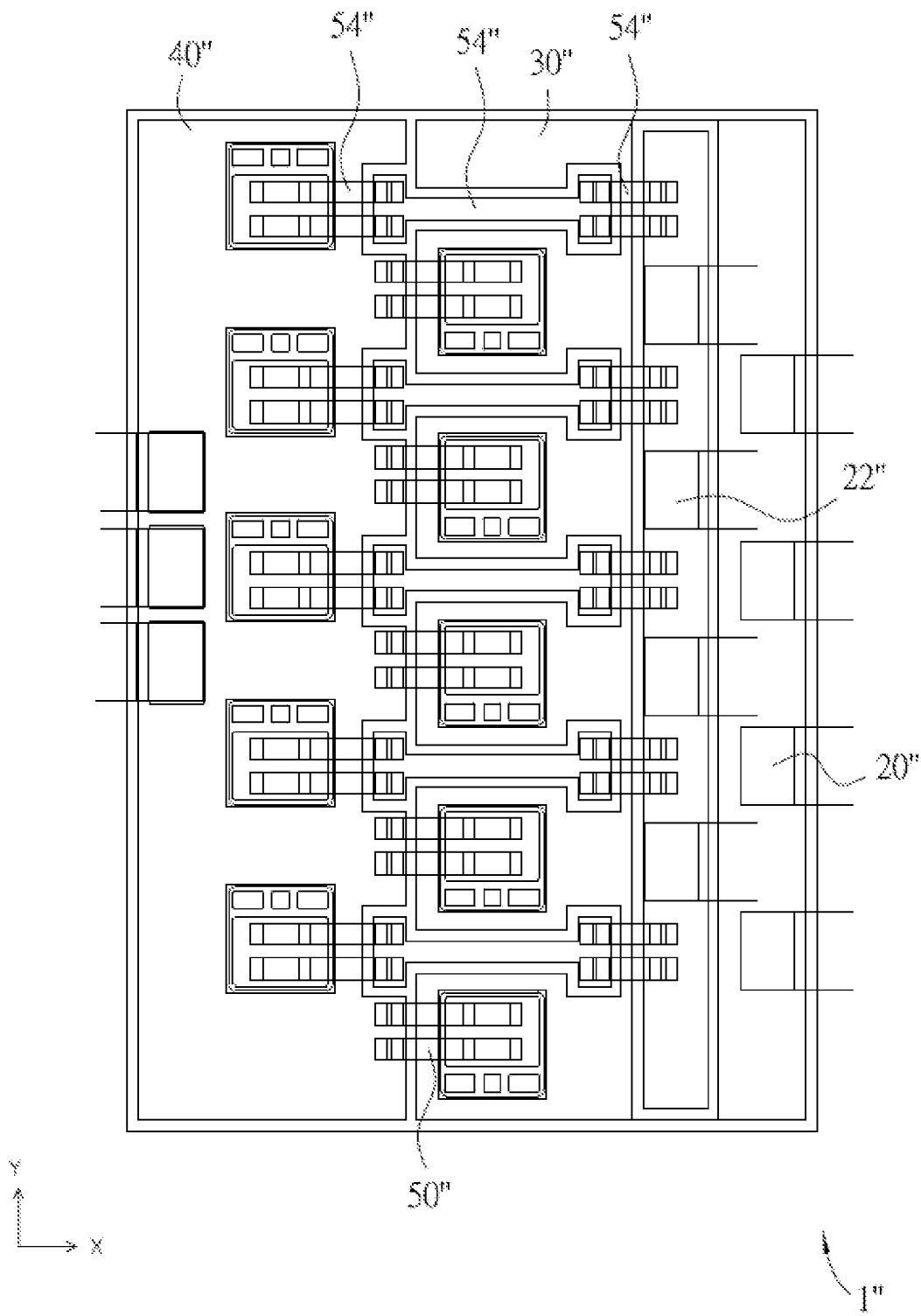
FIG. 9 is a top view of a third example of the disclosure.

FIG. 9 illustrates a illustrates a power module 1" according to a third example of the disclosure, wherein those components identical to the preceding two examples will not be detailed. In this example, the first circuit base portion 30" and the second circuit base portion 40" are mutually insulative conductive copper layers which are arrayed on a dielectric layer; the input current is inputted from the current input bus bar 20", flows through the first power devices and the serially-connected conductive members 50" to the second power devices, and then flows back through three segments of output conductive members 54" to the current output bus bar 22". Among the three segments of output conductive members 54", one segment is a structure comprising 5 elongated copper layers, corresponding to the conductive board 5 in the first example of the disclosure, further generating a staggered interleaving feature of the disclosure. Therefore, the conductive members referred to in the disclosure are not limited to metal wires; instead, any equivalent structure having the features of the disclosure falls into the scope of the disclosure.

The power module as disclosed enables even sharing of the input high current by the paralleled circuits and power devices, which ensures homogenous distribution in the current flowing process; moreover, the circuits form a staggered loop where the almost overlapping loops inside the module are interleaved with and corresponding to each other. This staggered interleaving conduction topology significantly reduces the parasitic inductance effect. Accordingly, the module provided by the disclosure may reduce the parasitic inductance till below 5 nH; particularly, by arranging the source bus bars and the drain bus bars at lateral edges or in the center, the circuit facilitates circuit leading-out. The illustrations of the above examples are intended only for easy understanding, not for limiting. Any equivalent effects and other variations and modifications according to the appended claims fall within the protection scope of the disclosure.

We claim:

1. A low parasitic inductance power module featuring staggered interleaving conductive members, comprising:
   at least one electrically insulative base extending along a length direction;
   a substrate provided with at least one current input bus bar along a width direction which is perpendicular to the length direction and at least one current output bus bar which is parallel to the current input bus bar and electrically insulated from the current input bus bar;
   a first unit comprising a first circuit base portion disposed at the electrically insulated base along the width direction perpendicular to the length direction, on the first circuit base portion being disposed a plurality of first power devices, each of the first power devices having a first current input terminal and a first current output terminal, the first current input terminals of the first power devices being parallel connected with each other, the first current output terminals of the first power devices being parallel connected with each other; wherein the first current input terminals are conductively mounted to the first circuit base portion, or alternatively, the output terminals are conductively mounted to the first circuit base portion;

a second unit comprising a second circuit base portion which is disposed at the electrically insulated base along the width direction perpendicular to the length direction and spaced apart from the first circuit base portion in the length direction, on the second circuit base portion being disposed a plurality of second power devices, each of the second power devices having a second current input terminal and a second current output terminal, the second current input terminals of the second power devices being parallel connected with each other, the second current output terminals of the second power devices being parallel connected with each other; wherein the second current input terminals are conductively mounted to the second circuit base portion, or alternatively, the second current output terminals are conductively mounted to the second circuit base portion;

wherein the first unit and the second unit are serially connected via their respective one ends along the length direction through a plurality of mutually staggered arrayed serially-connected conductive members, the other end of the first unit opposite the one end thereof is serially connected to the current input bus bar through a plurality of mutually staggered arrayed input conductive members, and the other end of the second unit opposite the one end thereof is serially connected to the current output bus bar through a plurality of mutually staggered arrayed output conductive members; wherein when lengthwise projections of the serially-connected conductive members, the input conductive members, and the output conductive members overlap, their projections in the width direction are arrayed in a staggered interleaving mode, and/or their projections overlap with each other in a height direction perpendicular to the length direction and the width direction, whereby when current flows through the staggered serially-connected conductive members, the staggered input conductive members, and the staggered output conductive members, individual inductances are countered with each other, reducing the overall parasitic inductance.

2. The low parasitic inductance power module featuring staggered interleaving conductive members according to claim 1, wherein the substrate is disposed between the first power devices and the second power devices along the length direction.

3. The low parasitic inductance power module featuring staggered interleaving conductive members according to claim 1, wherein the electrically insulative base is a dielectric layer, and the first circuit base portion and the second circuit base portion are two sheets of mutually insulatively metal circuit layers formed on the dielectric layer.

4. The low parasitic inductance power module featuring staggered interleaving conductive members according to claim 3, wherein when the serially-connected conductive members, the input conductive members, and the output conductive members have their projections overlap in the length direction, the staggered serially-connected conductive members, the staggered input conductive members, and the staggered output conductive members have their projections arrayed in a staggered interleaving mode in the width direction.

5. The low parasitic inductance power module featuring staggered interleaving conductive members according to claim 1, wherein the first circuit base portion and the second circuit base portion are two sheets of circuit boards disposed on the electrically insulative base, respectively; and wherein when the serially-connected conductive members, the input conductive members, and the output conductive members have their projections overlap in the length direction, the staggered serially-connected conductive members, the staggered input conductive members, and the staggered output conductive members have their projections overlap in a height direction perpendicular to the length direction and the width direction.

* * * * *